United States Patent
Kuo et al.

(10) Patent No.: US 7,468,906 B2
(45) Date of Patent: Dec. 23, 2008

(54) WORD DRIVER AND DECODE DESIGN METHODOLOGY IN MRAM CIRCUIT

(75) Inventors: Chien-Teh Kuo, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 0 days.

(21) Appl. No.: 11/530,704

(22) Filed: Sep. 11, 2006

(65) Prior Publication Data
US 2007/0070688 A1 Mar. 29, 2007

Related U.S. Application Data

(60) Provisional application No. 60/716,714, filed on Sep. 13, 2005.

(51) Int. Cl.
*G11C 11/00* (2006.01)
(52) U.S. Cl. ............ 365/158; 365/46; 365/55; 365/74; 365/97; 365/173
(58) Field of Classification Search ............ 365/158, 365/230.02, 230.03, 230.06, 230.07, 97, 365/173
See application file for complete search history.

(56) References Cited

U.S. PATENT DOCUMENTS

| | | | | |
|---|---|---|---|---|
| 6,055,178 A | * | 4/2000 | Naji | 365/158 |
| 6,256,224 B1 | * | 7/2001 | Perner et al. | 365/173 |
| 6,335,890 B1 | * | 1/2002 | Reohr et al. | 365/225.5 |
| 2005/0117426 A1 | * | 6/2005 | Theel | 365/210 |

* cited by examiner

*Primary Examiner*—Hoai V Ho
*Assistant Examiner*—Fernando N Hidalgo
(74) *Attorney, Agent, or Firm*—Thomas, Kayden, Horstemeyer & Risley

(57) ABSTRACT

A word line driver and decoder for use in a magnetic memory includes a main word line driver and a sub word line driver that cooperate to drive current on a selected one from a number of the magnetic memory's word lines. The main word line driver and sub word line driver employ pull up and pull down transistors that configured to drive current on the selected word line in either a read or write '0' direction or a read or write '1' direction in response to control signals that allow reliable magnetic memory operation. An address decoder selects and activates a multiplexer in the sub word line driver to coordinate the current drive. The main word line driver employs current mirrors, transistor switches, and logic control to prevent direct Vdd to Vss shorting in transitioning from '0' and '1', and read and write data storage operations.

20 Claims, 11 Drawing Sheets

WORD DRIVER AND DECODE DESIGN METHODOLOGY IN MRAM CIRCUIT

CROSS-REFERENCE TO RELATED APPLICATION

This application claims the priority benefit of U.S. Provisional Application Ser. No. 60/716,714, filed Sep. 13, 2005, the full disclosures of which are incorporated herein by reference.

BACKGROUND

1. Field of Invention

The present invention relates to a magnetic random access memory and more particularly to a magnetic random access memory having a word line driver and decoder that controls current during read and write operations.

2. Description of Related Art

Typical Magnetic Random Access Memory, MRAM, structures have a nonmagnetic layer sandwiched between two ferromagnetic films. The two ferromagnetic films are also known as magnetic thin films. The MRAM employs the magneto resistive properties of this structure to store data. In each storage element, an MRAM employs two lines, commonly termed a word line and a sense string, in order to detect the magnetization direction of these magnetic thin films. Each string comprises a magnetic thin film that serves as a memory element, and the word line generally addresses multiple sense strings. Magnetic thin films that have a parallel moment have a low resistance and are typically assigned the '1' state. Magnetic thin films having an anti-parallel moment have a high resistance and are typically assigned the '0' state, but may also be assigned to the '1' state.

During a read operation, a word current passes through the word line causing the magnetic layers in the sense string to rotate, thereby changing the resistance in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine resistive state of a storage element.

To implement reliable read and write operations requires the precise generation and control of current on the word line. Turn on transients have the potential to change the state of memory elements in a spurious manner thereby corrupting data integrity.

Thus, there is a need for methods and apparatus for generating a stable and reliable current on the word line.

There is a further need for methods and apparatus for controlling current on the word line.

SUMMARY

An magnetic random access memory with word line driver and decode apparatus, comprising a plurality of memory segment, a plurality of word lines, a main word line driver with a word line drive signal, a plurality of multiplexers and a sub word line driver with a mux control bus. The word lines, disposed on the memory segment, is capable of providing an electric field for reading and writing data on the magnetic random access memory. The main word line driver with the word line drive signal, the main word line driver is connected to one side of the word lines by the word line drive signal, is capable of providing a current for reading and writing operation to the word lines. The multiplexers, each of the multiplexers is connected to the other side of the respective word lines, is capable of controlling direction of the current on the word lines. The sub word line driver with a mux control bus, the sub word line driver is connected to the multiplexers by the mux control bus, is capable of choosing a required mutlieplexer from the multiplexers to be active. Wherein the main word line driver, the multiplexers and the sub word line driver together decode address and data storage operations to read and write on the magnetic random access memory.

The current controller, comprising a plurality of word lines, a main word line driver with a word line drive signal, a plurality of multiplexers and a sub word line driver with a mux control bus. The main word line driver with the word line drive signal, the main word line driver is connected to one side of the word lines by the word line drive signal, is capable of providing a current for reading and writing operation to the word lines. The multiplexers, each of the multiplexers is connected to the other side of the respective word lines, is capable of controlling direction of the current on the word lines; and the sub word line driver with the mux control bus, the sub word line driver is connected to the multiplexers by the mux control bus, is capable of choosing a required mutlieplexer from the multiplexers to be active. Wherein the main word line driver, the multiplexers and the sub word line driver together decode address and data storage operations and drive the word lines.

It is to be understood that both the foregoing general description and the following detailed description are by examples, and are intended to provide further explanation of the invention as claimed.

BRIEF DESCRIPTION OF THE DRAWINGS

The illustrative embodiment may best be described by reference to the accompanying drawings where.

Figure 1:
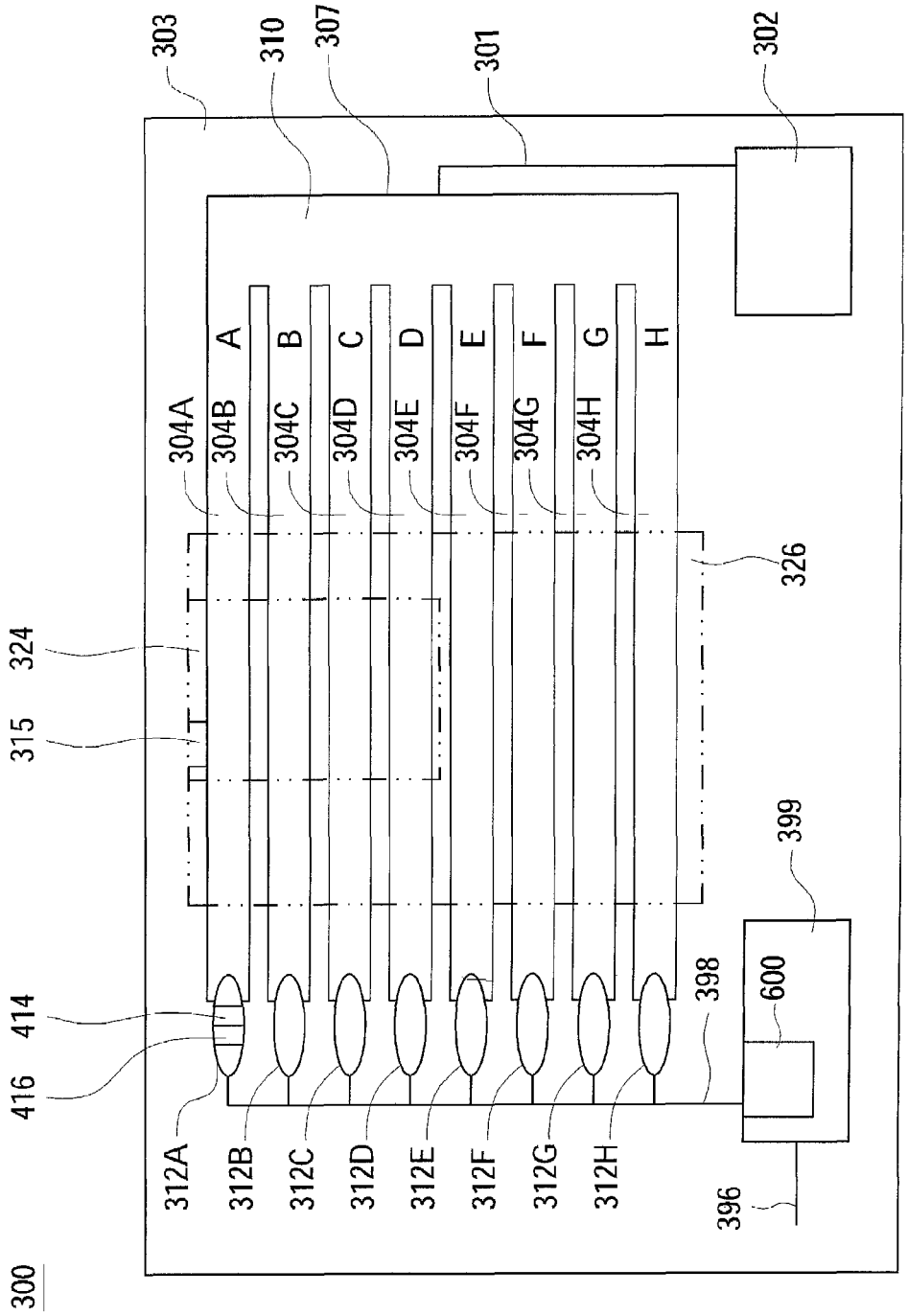
FIG. 1 shows a magnetic random access memory MRAM, having a word line driver and decoder according to one embodiment of the present invention.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Where used in the various figures of the drawings, the same numerals designate the same or similar parts. Furthermore, when the terms "side," "end," "bottom," "first," "second," "laterally," "longitudinally," "row," "column," and similar terms are used herein, it should be understood that these terms have reference only to the structure shown in the drawings as it would appear to a person viewing the drawings and are utilized only to facilitate describing the illustrative embodiment.

DESCRIPTION OF THE PREFERRED EMBODIMENTS

Refer now to FIG. 1, which shows an MRAM 300 with the MRAM word line driver and decode apparatus 303 of one embodiment of the invention. The MRAM word line driver and decode apparatus 303 includes a main word line driver 302, and a sub word line driver 399, a plurality of multiplexers 312A-312H, which together decode address and data storage operations and drive word lines 304A-304H. In one embodiment, the MRAM 300 performs data storage operations such as read a memory element or write a memory element with the current control capabilities of the MRAM word line driver and decode apparatus 303.

In one embodiment, the word line 304A is connected to multiplexer 312A, word line 304B is connected to multiplexer 312B, word line 304C is connected to multiplexer 312C, and word line 304D is connected to multiplexer 312D and so on. The multiplexer 312A-312H further include a way of controlling current, such as a P-channel transistor, a muxP transistor 414, and an N channel transistor, a muxN transistor 416, which is shown in more detail with reference to FIG. 5. The multiplexers 312A-312H are connected to the sub word line driver 399 by mux control bus 398. The word lines 304A-304H along with conducting header 310 include a word line comb 307. The conducting header 310 is capable of carrying and distributing current to each word line 304A-304H. In one embodiment, the conducting header 310 is constructed from a metal layer and the conducting header 310 is directly connected to the word lines 304A-304H on the same metallization layer. The word line comb 307 is constructed as shown with reference to FIGS. 2, 3A and 3B. The main word line driver 302 generates the word line drive signal 301, which is connected to the word line comb 307.

To provide current first in one direction and then in the opposite direction in a word line, one side of each word line 304A-304H is connected to the main word line driver 302 and at the other end of each word line 304A-304H is connected to the sub word line driver 399 with multiplexers 312A-312H.

Figure 6:
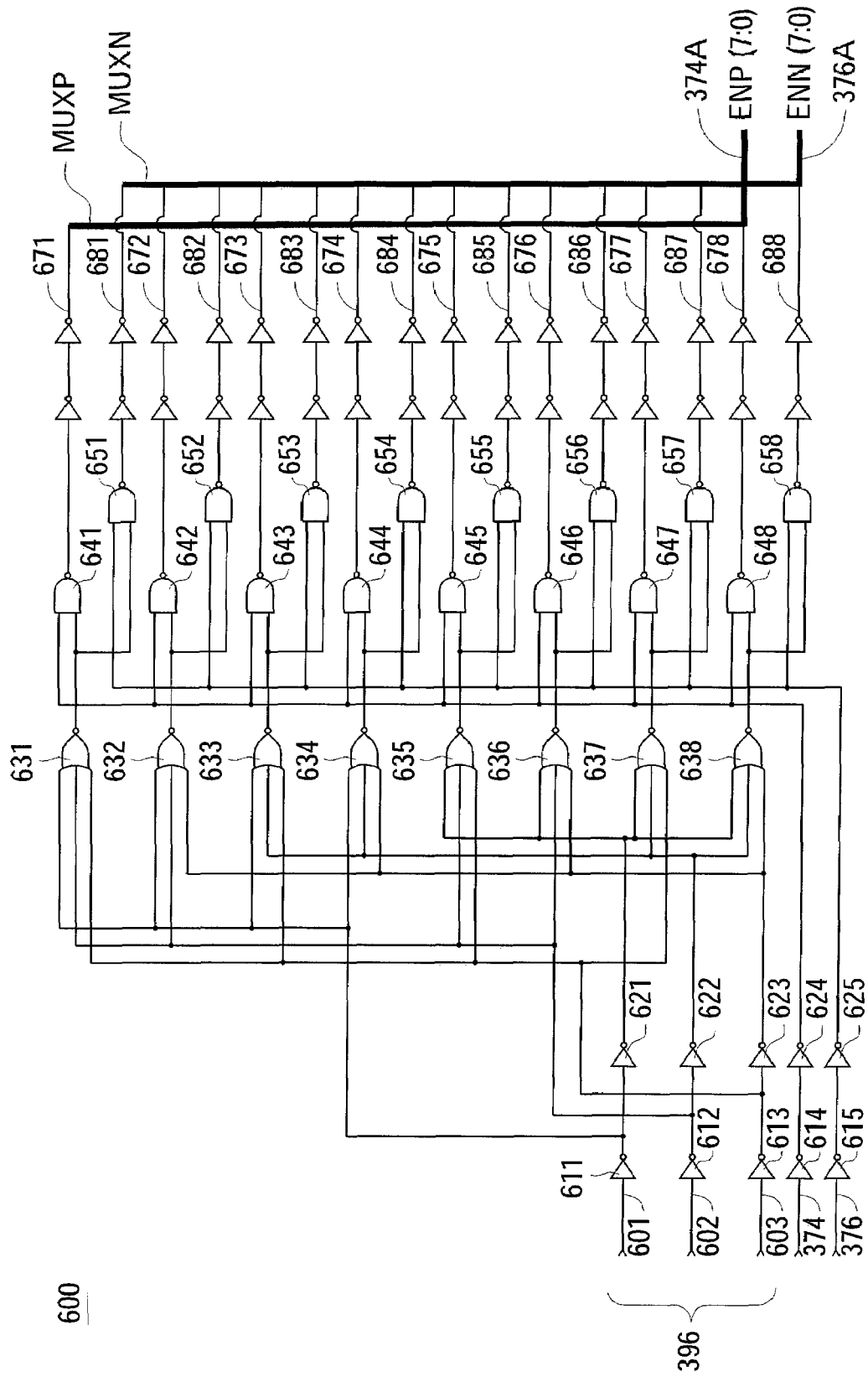
FIG. 6 shows a multiplexer decoder according to the one embodiment of the present invention.

To activate each multiplexers 312A-312H, a multiplexer decoder 600, shown in more detail in FIG. 6, is provided in the sub word line driver 399. Depending on the main word line driver 302 pitch, pitch being the number of word lines, the multiplexer decoder 600 selects which one of the multiplexers 312A-312H to activate, which in turn activates the word line needed. Depending on the operation desired, either a read or a write, the main word line driver 302 activates a pull-up or pull-down node to establish a current in the selected one of the word lines 304A-304H in the proper direction.

Those skilled in the art will recognize that more word lines or fewer word lines, for example, 2, 4, 8, 16, 32, 64,128, 256 or 1024 lines, may be connected without deviating from scope of the present invention. For example, in an embodiment having an address with three address lines, where all three address lines are decoded, eight word lines are available to select from in a binary address decode.

The word lines 304A-304H provide an electric field, when energized, to read and write data on the MRAM 300 on magnetic bit elements 326 that are known as spot or bit elements. A representative example 324 (MRAM segment 324) of a part of the MRAM 300 is shown also with reference to FIGS. 2, 3A and 3B. The small elements of magnetic material, a representative example is shown as bit element 315, are accessed in two ways, either by a read current down a selected one of the word lines 304A-304H or a write current down a selected one of the word lines 304A-304H. In one embodiment, the any one of the word lines 304A-304H carries a metal carrier current. The relatively large current in a word line 304A-304H generates a magnetic field near the activated word line. The direction of the field follows the right-hand rule where a thumb points in the direction of the current as is conventionally known. The magnetic bit elements 326 are connected together as shown with reference to FIGS. 2, 3A and 3B.

In operation, a large current of 30 or 40 milliamps is sourced or sinked down a selected one of the word lines 304A-304H by a pull-up or pull-down transistor configuration described herein. When the current flows from the main word line driver 302 to a selected one of the multiplexers 312A-312H, or right to left on FIG. 1, the MRAM 300 performs a read or write '1' operation. When the current flows from a selected one of the multiplexers 312A-312H to the main word line driver 302, or left to right on FIG. 1, the MRAM 300 performs a read or write '0' operation. In one embodiment, the activated word line or the word lines 304A-304H handle approximately 20 to 40 milliamps of current; a relatively large amount of current to be turned on and off on the MRAM 300 word line comb 307. By way of illustration and not limitation, the read operation places 20 milliamps on the word line 304A-304H and the write operation places 40 milliamps on the word line 304A-304H.

The multiplexers 312A-312H control what particular word line of the word lines 304A-304H is active. The four modes of operation, that of reading a '0', writing a '0', reading a '1' and writing a '1' is discussed in greater detail herein. In either the read or write mode, the sub word line driver 399 chooses a particular multiplexer from the plurality of multiplexers 312A-312H to be active, based on the address input signal 396. To implement a read the main word line driver 302 sources or sinks a current to the selected multiplexer 312A on word line drive signal 301 on the chosen word line, for example 304A. In this example the multiplexer 312A and the main word line driver 302 provides a current path to allow current flow across the intended bit element 315. To implement a write operation the main word line driver 302 sources or sinks a larger current, where in one embodiment a current that is twice as large as the read current, from a selected multiplexer, for example multiplexer 312A, to allow current to flow over the selected bit 315 in word line 304A.

The operation of the multiplexers are discussed with reference to FIG. 5 and each mode of operation is discussed in depth with reference to FIGS. 7, 8, 9 and 10.

Figure 2:
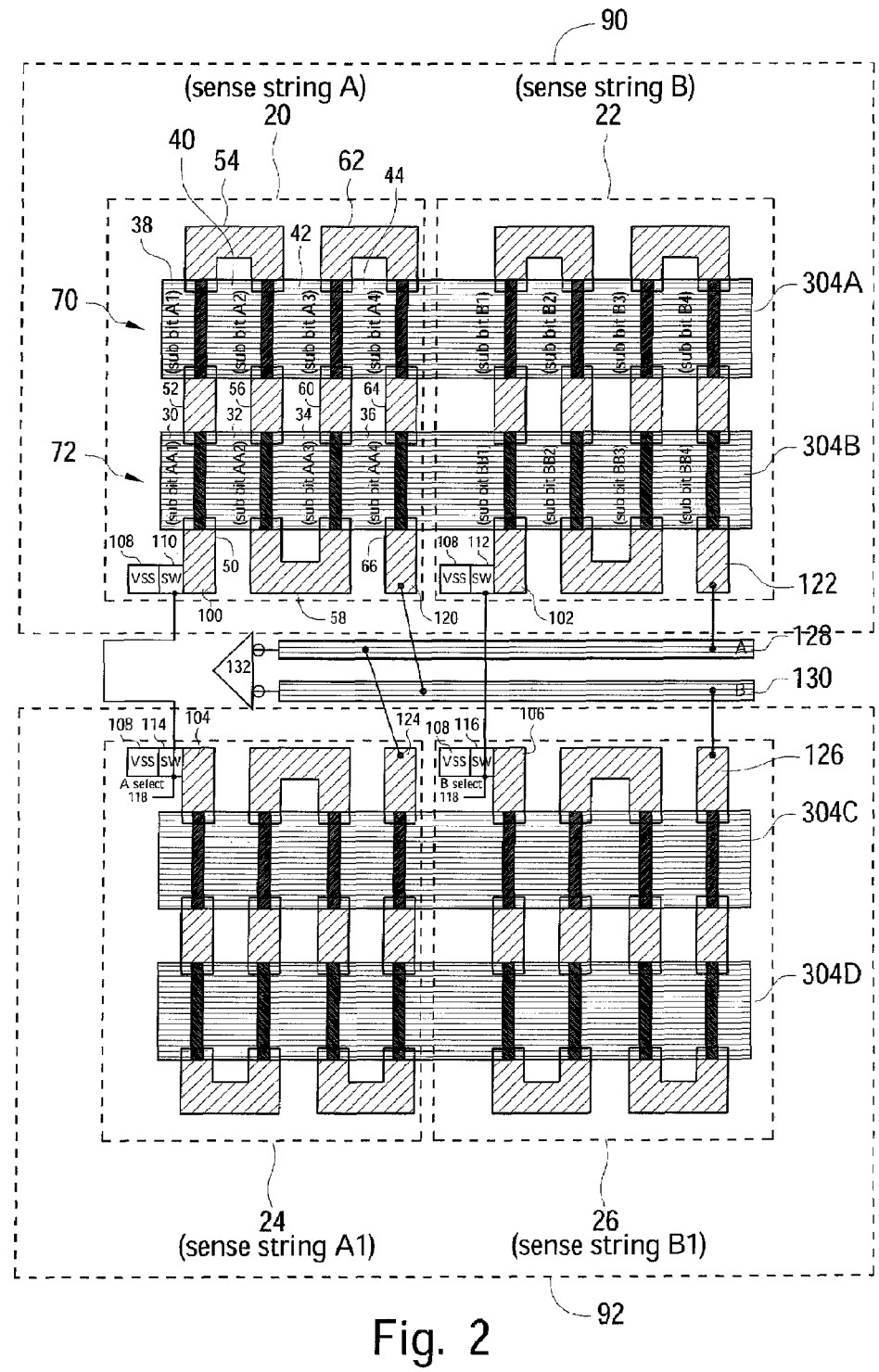
FIG. 2 shows a top view of an MRAM segment according to one embodiment of the present invention, with portions of the MRAM structure removed.

A top view of an MRAM segment 324 having an MRAM word line driver and decode apparatus 303 that operates in an MRAM 300 according to one embodiment of the present invention is shown in FIG. 2. Those skilled in the art will be aware that the MRAM 300 contains other structures and layers, such as a transistor layer that may be formed from silicon, polysilicon, various metal interconnecting layers and other layers that are well known in the art. These elements are not shown for the sake of clarity.

Refer to FIG. 2, the MRAM segment 324 includes a plurality of sense strings 20, 22, 24, 26. Each sense string 20, 22, 24, 26 includes one or more sub bits 30, 32, 34, 36, 38, 40, 42, 44 connected by strap layer segments 50, 52, 54, 56, 58, 60, 62, 64, 66 (for example, the sense strings are positioned on and orthogonal to the word lines, the strap layer segments are positioned between the word lines, each of the sense strings is connected by the strap layer segments in series). In one embodiment of the present invention, the strap layer segments 50, 52, 54, 56, 58, 60, 62, 64, 66 connect the sub bits 30, 32, 34, 36, 38, 40, 42, 44 in series (for example, the sub bits are positioned on and orthogonal to the word lines, each of the sub bits is connected by the strap layer segments in series). In further aspects of one embodiment, the structure of the sense strings 20, 22, 24, 26 have a serpentine conformation. In this conformation, groups of two sub bits 30, 32, 34, 36, 38, 40, 42, 44 form linear components. The strap layer segments 50, 52, 54, 56, 58, 60, 62, 64, 66 provide a connection to join the sub bits 30, 32, 34, 36, 38, 40, 42, 44 into these linear components. Four of these linear components are located parallel to one another. The strap layer segments 50, 52, 54, 56, 58, 60, 62, 64, 66 also form a connection to join the linear components at alternating ends in order to connect the sub bits 30, 32, 34, 36, 38, 40, 42, 44 in series. In one embodiment, the sense string 20 includes eight sub bits 30, 32, 34, 36, 38, 40, 42, 44 connected in series. In another embodiment, the sense strings 20, 22, 24, 26 may include a single sub bit. Depending on the application, different 10 numbers of sub bits and as well as different arrangements of the sub bits may be employed without departing from the spirit and scope of the invention.

The sub bits 30, 32, 34, 36, 38, 40, 42, 44 include the data storage element of the MRAM segment 324. These sub bits 30, 32, 34, 36, 38, 40, 42, 44 may also be termed memory spots. In one embodiment, the sub bits or memory spots 30, 32, 34, 36, 38, 40, 42, 44 are grouped in fours, where the upper four memory spots 38, 40, 42, 44 include an upper bit 70 and the lower four memory spots 30, 32, 34, 36 include a lower bit 72 like the bit 315 shown in FIG. 1.

The MRAM segment 324 employs a word line 304A, 304B, 304C and 304D to address a selected bit. In one embodiment, the MRAM segment 324 uses two word lines 304A and 304B to address a sense string 20, 22 with an upper word line 304A addressing the memory spots 38, 40, 42, 44 of the upper bit 70 and a lower word line 304B addressing the memory spots 30, 32, 34, 36 of the lower bit 72. The upper word line 304A intersects each of the upper sub bits 38, 40, 42, 44 so that a sense current passing through the upper sub bits 38, 40, 42, 44 is orthogonal to a word current passing through the upper word line 304A. Likewise, the lower word line 304B intersects each of the lower sub bits 30, 32, 34, 36 so that a sense current passing through the lower sub bits 30, 32, 34, 36 is orthogonal to a word current passing through the lower word line 304B.

In an MRAM 300 structure, an array 90 of sense strings includes multiple sense strings 20, 22 positioned adjacent to one another in a linear arrangement. These sense strings 20, 22 have the same general shape, so that a word line 304A, 304B may address the sub bits 30, 32, 34, 36, 38, 40, 42, 44 of each sense string in the array 90. In one embodiment, an array 90 includes thirty-three sense strings 20, 22 that may each be addressed by the upper word line 304A and the lower word line 304B. As those skilled in the art will understand, the word line 304A, 304B may address more or fewer sense strings 20, 22 without departing from the spirit or scope of the present invention. The sub bits 30, 32, 34, 36, 38, 40, 42, 44 of each sense string 20, 22 must be positioned so that a sense current passing through the sub bits 30, 32, 34, 36, 38, 40, 42, 44 is orthogonal to a word current passing through the word line 304A, 304B.

Each sense string 20, 22, 24, 26 has an input end 100, 102, 104, 106 connected to a voltage source Vss 108 through a switch 110, 112, 114, 116. A transistor may serve as the switch 110, 112, 114, 116. A signal 118 triggers the switch 110, 112, 114, 116 of a selected sense string 20, 22, 24, 26 to allow a sense current to pass through the respective sense string 20, 22, 24, 26. Each sense string 20, 22, 24, 26 also has an output end 120, 122, 124, 126 connected to a sense line 128, 130. In one embodiment, an MRAM segment 324 includes two sense lines, an upper sense line 128 and a lower sense line 130, respectively. The MRAM segment 324 further includes two arrays of sense strings, an upper array 90, and a lower array 92, the upper array 90 is positioned above the two sense lines 128, 130 and the lower array 92 is positioned below the two sense lines 128, 130.

The MRAM segment 324 of one embodiment of the present invention provides for noise stabilization and reduction through the arrangement of the connections of the respective output ends 120, 122, 124, 126 of the sense strings of the upper array 90 and the lower array 92. In one example embodiment, shown in FIG. 1, the output end 120, 122 of each of the sense strings 20, 22 of the upper array 90 is connected alternately to the upper sense line 128 and the lower sense line 130. Thus, in this example embodiment, sense string A 20 is connected to the lower sense line 130, and sense string B 22 is connected to the upper sense line 128. Likewise, the output end 124, 126 of each of the sense strings 24, 26 in the lower array 92 is connected alternately to the upper sense line 128 and the lower sense line 130. In this example embodiment shown, sense string 24 is connected to the upper sense line 128 and sense string 26 is connected to the lower sense line 130. This pattern of connection of the output ends 120, 122, 124, 126 of the sense strings 20, 22, 24, 26 continues for each of the sense strings 20, 22, 24, 26 in the 90, 92. Those skilled in the art will understand that other patterns of connection of the output ends 120, 122, 124, 126 of the sense strings 20, 22, 24, 26 may be employed without departing from the spirit or scope of the present invention.

The upper sense line 128 and the lower sense line 130 provide the signal from the sense strings 20, 22, 24, 26 to a differential amplifier 132. The differential amplifier 132 detects the voltage difference in the signal provided by the upper sense line 128 and the lower sense line 130. Determination of the state of a selected bit makes use of the output of the differential amplifier 132.

Figure 3A:
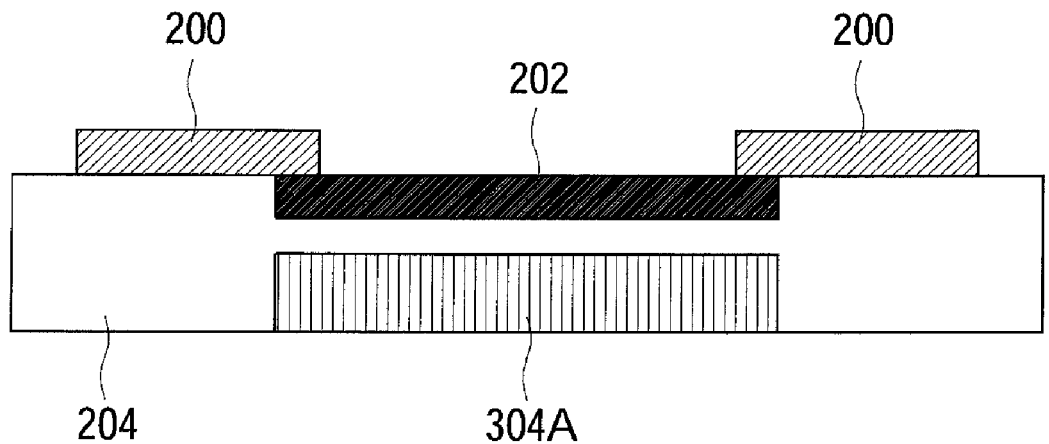
FIG. 3A shows an end view of a sense string and word line, with portions of the MRAM structure removed to show details of the structure of the sense string and word line.
Figure 3B:
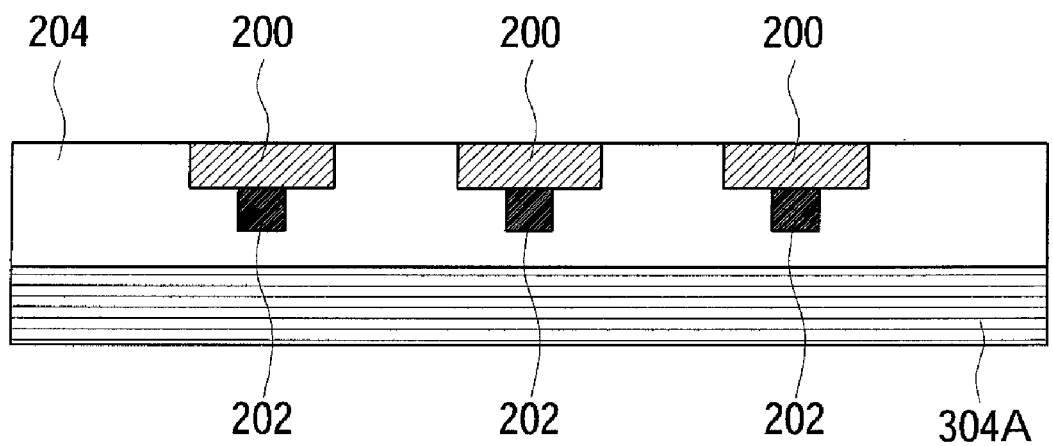
FIG. 3B shows a side view of a sense string and word line, with portions of the MRAM structure removed to show details of the structure of the sense string and word line.

FIGS. 3A and 3B show an end view and a side view, respectively, of a sense string and the word line 304A, with portions of the MRAM 300 structure removed to show details of the structure of sense string and the word line 304A. The MRAM 300 has a strap layer 200 and a bit layer 202 embedded within a dielectric insulating layer 204. The sub bits 30, 32, 34, 36, 38, 40, 42, 44 are formed from sections of the bit layer 202 embedded within the dielectric insulating layer 204. As shown in FIGS. 3A and 3B, the strap layer 200 overlies the bit layer 202. The strap layer 200 provides connections between the sub bits 30, 32, 34, 36, 38, 40, 42, 44. Overlap between the strap layer 200 and the sub bits 30, 32, 34, 36, 38, 40, 42, 44 provide contact between the strap layer 200 and the sub bits 30, 32, 34, 36, 38, 40, 42, 44. The word lines 304A are also embedded within the dielectric insulating layer 204, and in one embodiment, the sense strings 20, 22, 24, 26 overlie the word line 304A.

Refer to FIG. 2, the present invention provides for a greater signal differential by employing multiple sub bits 30, 32, 34, 36, 38, 40, 42, 44 for each bit 70, 72. These memory spots each have the same magnetization state. Thus, in a high resistance state, or "0" state, the difference in resistance from a low resistance state, or "1" state, will be proportional to the number of memory spots 30, 32, 34, 36, 38, 40, 42, 44 in a bit 70, 72. In one embodiment, sub bits A1-A4 (38, 40, 42, 44) and sub bits AA1-AA4 (30, 32, 34, 36) each include one bit respectively. By connecting these memory spots in series, the example embodiment shown provides a signal having a voltage drop four times the magnitude that would be provided from a single memory spot. More or fewer memory spots or sub bits may be employed for each bit to provide a signal having a desired magnitude.

The present invention also provides for a greater memory capacity by employing multiple groups of sub bits 30, 32, 34, 36, 38, 40, 42, 44 on sense string 20. Each group of sub bits 30, 32, 34, 36, 38, 40, 42, 44 on the sense string 20 includes a separate bit and has a word line 304A, 304B so that each group of sub bits 30, 32, 34, 36, 38, 40, 42, 44 may be addressed separately. In one embodiment of the present invention, an upper word line 304A addresses upper sub bits 38, 40, 42, 44 and a lower word line 304B addresses lower sub bits 30, 32, 34, 36. A word current through either one of the word lines 304A or 304B addresses the respective sub bits while not appreciably changing the resistance of the other sub bits. More or fewer groups of sub bits may be employed without departing from the scope of the present invention.

The MRAM 300 queries the state of a bit using a sense current and a word current. By way of example, and not limitation, determination of the lower bit 72 begins by sending a signal, Aselect, that triggers the switches 110, 114 for a first sense string 20 and a reference sense string 24. This allows a sense current from Vss to flow through each respective sense string 20, 24. Concurrently, the MRAM 300 applies a word current through the lower word line 304B of the upper array 90. All other sense strings 22, 26 and word lines 304A, 304C, 304D remain inactive. The magnetic field from the word current and the sense current cause the magnetic layers of the sub bits 30, 32, 34, 36 to rotate, changing the resistance of the sub bits 30, 32, 34, 36 to the sense current. By way of example, the current through the sense strings 20, 24 can be on the order of 3-5 milliamps and the current passing through the word line 304B can be on the order of 20-50 milliamps. These values are representative and may vary without deviating from the scope of the invention.

In the foregoing example, a lower sense line 130 receives the sense current from the sense string 20. A second sense string, reference sense string 24, acts as a reference for sense string 20 and provides a reference signal unaffected by a word current. An upper sense line 128 receives the sense current through sense string 24. In a similar fashion, when the MRAM segment 324 addresses a bit on sense string 24, sense string 20 may serve as a reference. The differential amplifier 132 samples the signals from the upper sense line 128 and the lower sense line 130. The differential amplifier 132 includes circuitry (not shown) to employ an auto zero technique that locks in the difference of the signals from the upper sense line 128 and the lower sense line 130 as a base value. The current on the word line 304B is then reversed, causing the resistance of the memory spots 30, 32, 34, 36 to change because of the change of the magnetic field generated by the word line 304B. The differential amplifier 132 then samples the signals from the upper sense line 128 and the lower sense line 130 again and provides the results to a comparator (not shown).

In the foregoing example, the differential amplifier 132 receives a signal from the sense string 20 on the lower sense line 130 and a signal from reference sense string 24 on upper sense line 128. However, in addition to the signal from the sense current passing through the sense string 20, the current from the word line 304B has a capacitive interconnect with the sense string 20 and each of the sense strings 22 in the same array as the sense string 20. By coupling a first portion of each array 90 of sense strings to the upper sense line 128 and a second portion of each array of sense strings to the lower sense line 130, the MRAM segment 324 reduces the amount of noise seen by each sense line 128, 130 proportional to the portion of sense strings coupled to the other sense line. In one embodiment, alternating sense strings in an array are coupled the upper sense line 128 and the lower sense line 130, respectively, reducing the amount of noise from capacitive coupling by approximately fifty percent. The cross coupling of the sense strings 20, 22, 24, 26 balances the noise generated in the sense strings by activation of the word line between the upper sense line 128 and the lower sense line 130.

Figure 4:
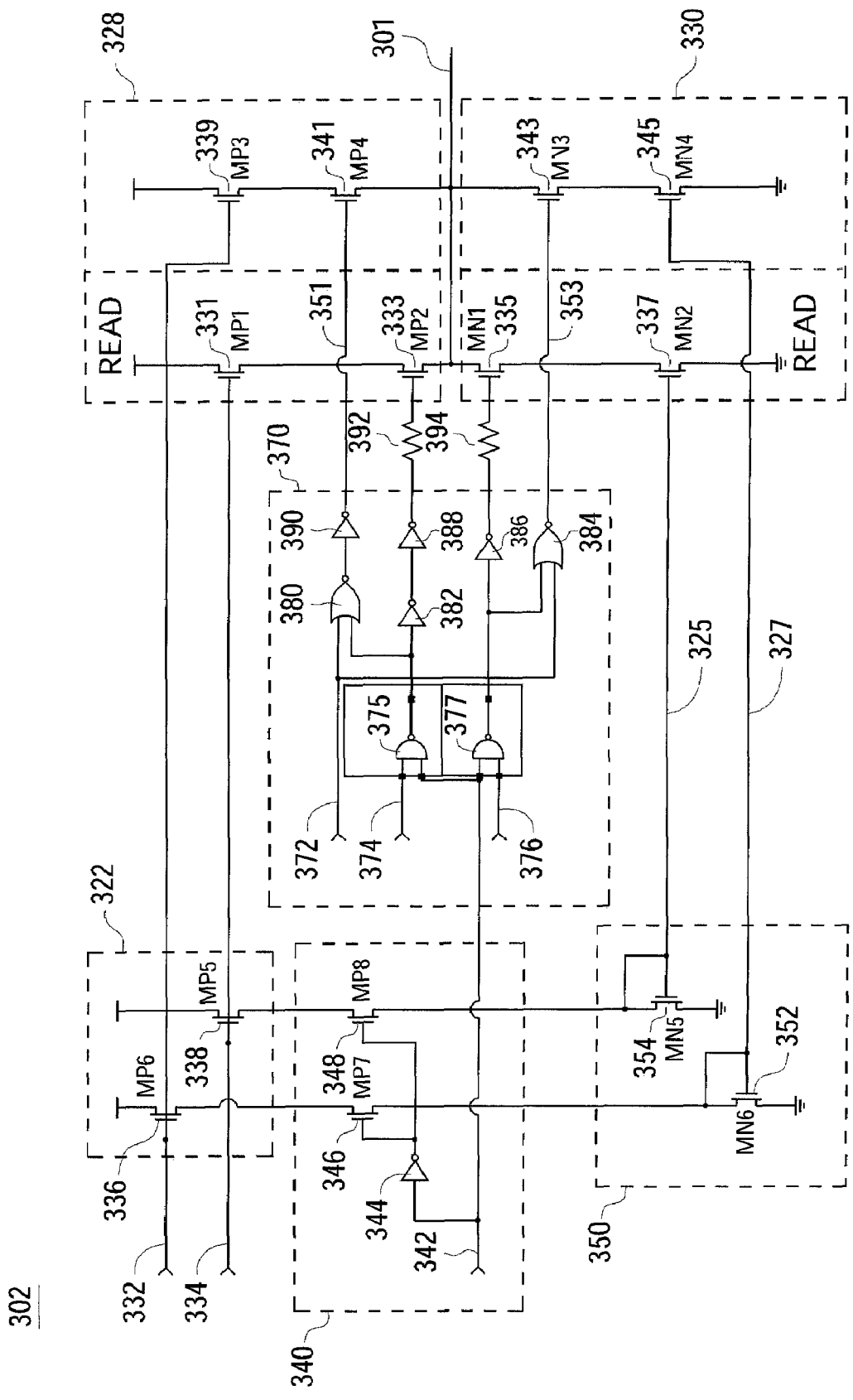
FIG. 4 shows a magnetic random access memory word line driver and decoder utilizing one embodiment of the present invention.

Now refer to FIG. 4, which shows the main word line driver 302 in more detail. The main word line driver 302 includes a write '1' bias circuit 322, a write '0' bias circuit 350, a logic control circuit 370, a '1' direction circuit 328 and a '0' direction circuit 330. The control inputs to the main word line driver 302 include a word line bias write signal designated as the WLBIASW signal 332, a word line bias read signal is designated the WLBIASR signal 334, and an enable word line signal is designated the ENWL signal 342. The output of the main word line driver 302 is the word line drive signal 301. The write '1' bias circuit 322 receives the WLBIASW signal 332 into transistor MP6 336. The WLBIASW signal 332 is also connected to a transistor MP3 339 in the '1' direction circuit 328. The WLBIASR signal 334 is connected to a transistor MP5 338 in the write '1' bias circuit 322. The WLBIASR signal 334 is also connected to the transistor MP1 331 in the '1' direction circuit 328. The driver enable circuit 340 includes an inverter 344, which drives transistor MP7 346 and transistor MP8 348. The ENWL signal 342 is connected to the input of inverter 344, and controls the operation of transistor MP7 346 and transistor MP8 348. The write '0' bias circuit 350 includes a transistor MN6 352 and a transistor MN5 354. The transistor MN6 352 is connected to transistor MP7 346 and acts as a current mirror. A transistor MN5 354 is connected to transistor MP8 348 and also acts as a current mirror. The transistor MN5 354 outputs the bias read signal 325 (BIASNR). The transistor MN6 352 generates the bias write signal, designated the BIASNW signal 327. The '0' direction circuit 330 receives the bias read signal 325 to a transistor MN2 337. The transistor MN4 345 receives the BIASNW signal 327. The logic control circuit 370 receives three control signals. The signals are a write signal 372; an enable P signal, designated the ENP signal 374, and an enable N signal, designated the ENN signal 376. The ENP signal 374 is fed to a NAND gate NAND1 375 and the ENN signal 376 is fed to a NAND gate NAND2 377. The NAND1 375 receives both the ENP signal 374 and the ENWL signal 342 and outputs a control signal that is received by a NOR 380 and inverter 382. The NOR 380 also receives the write signal 372 and provides an output to an inverter 390 that generates the NPW signal 351. The output of the NAND1 375 also drives the input of inverter 382 which is a signal again inverted by inverter 388 which drives the resistor R1 392 which in turn is connected to the gate of a transistor MP2 333. NAND2 377 drives both the inverter 386 and NOR 384. NOR 384 also is connected to the write signal 372 and generates the write N signal designated as the NNW signal 353. The output of inverter 386 drives the resistor R2 394, the output of which is connected to the transistor MN1 335. The transistors MP2 333, MP4 341, MN1 335 and MN3 343 all drive the word line drive signal 301.

The main word line driver 302 handles variable biases, to allow for a word line 304A current variance that can vary in the milliamps range. For example, in one embodiment, a variable biasing scheme is implemented to handle either 42 milliamps or 44 milliamps for a write, and 18, 22 or 21 milliamps for a read. For example, the current in a word line 304A has the same magnitude for a write '1' and write '0' operation but have opposite directions.

The ENWL signal 342 enables the driver enable circuit 340. When the ENWL signal 342 is high, transistor MP7 346 and transistor MP8 348 are turned on because the gate of transistor MP7 346 and transistor MP8 348 are going to be low. In this control state current is allowed to pass through transistor MP7 346 and transistor MP8 348. When the ENWL signal 342 is low, transistors MP7 346 and MP8 348 are off, disabling the main word line driver 302.

The logic control circuit 370 also receives the ENWL signal 342 and receives the write signal 372 and the ENP signal 374 and the ENN signal 376. The write signal 372 determines whether the MRAM 300 is performing a write or read operation. The write mode is the high current mode and the read mode is the low current mode where a write is indicated by a logic '1' and a read is indicated by a logic '0' on the write signal 372.

The ENP signal 374 and the ENN signal 376 are connected to the NAND1 375 and NAND2 377 that provides directional control for the '1' direction circuit 328 and the '0' direction circuit 330. The ENP signal 374 enables the '1' direction circuit 328 and the ENN signal 376 enables the '0' direction circuit 330. The logic control circuit 370 ensures that only one of these circuits will be on at any one time. The resistors R1 392 and R2 394 are connected to the gates of transistors MP2 333 and MN1 335 respectively. During the read mode, the resistors R1 392 and R2 394 give an RC characteristic that slows the turn-on of the transistor MP2 333 and the transistor MN1 335. This slowing decreases spiking when the devices are turned on, using an RC delay. These resistor values are chosen based on the characteristics of other circuit elements and are provided by way of example and not limitation.

The write '1' bias circuit 322 has the WLBIASW signal 332 and the WLBIASR signal 334 as inputs that carry bias voltages from a temperature-compensated voltage supply, not shown. Voltage on the WLBIASW signal 332 biases the P channel transistor MP6 336 at mid-rail, or approximately 2.9 volts, SO that the P channel transistor MP6 336 is not fully turned on. The WLBIASW signal 332 limits the current coming from the terminal on transistor MP6 336 flowing down. The WLBIASW signal 332 is also connected to the '1' direction circuit 328 at transistor MP3 339 which also limits and controls the current through transistor MP3 339 because the device is not fully turned-on in a bias mode. When transistor MP6 336 is partially turned on, it acts essentially as a current source that feeds down through to transistor MN6 352. When this full circuit is turned on, transistor MP7 346 and transistor MP8 348 are shorts, basically allowing things to pass down through. And at the bottom, transistor MN6 352 is part of a current mirror. The transistor MN4 345, with a 400 over 30 ratio, generates current that flows into transistor MN3 343. The BIASNW signal 327 connects to the gate of transistor MN4 345 and controls the write branch of the '0' direction circuit 330.

The WLBIASR signal 334 biases the transistor MP5 338 and the transistor MP1 331 is a similar fashion. The WLBIASR signal 334 drives the transistor MP5 338 in the same range of voltage as transistor MP6 336, which in turn controls the transistor MP1 331. The current from the word line bias read signal, designated as the WLBIASR signal 334 mirrors through the transistor MN5 354 and is feed to another 400 over 30 ratio transistor MN2 337 to provide the bias read signal 325.

In one mode, the driver enable circuit 340 is turned off. When the ENWL signal 342 goes low, the gates of transistors MP7 346 and MP8 348 are high, which makes them open circuit. Therefore, no current flows down to transistor MN6 352 or transistor MN5 354 through that line and goes into the current mirrors. Since there is no current coming down through them, there is no ratioing and no current magnification or multiplication that goes into the transistors MN2 337 and transistors MN4 345. The driver enable circuit 340, in this mode, shuts down the remaining circuitry.

The '1' direction circuit 328 includes two current sources; a transistor MP1 331 and a transistor MP3 339. The transistor MP1 331 and the transistor MP3 339 are controls operating at mid-range and the voltage of gate-source ($V_{GS}$) equaling approximately 2.9 volts. The transistor MP1 331 and the transistor MP3 339 act as current sources physically ready to go, but not going. The transistors MP4 341 and MP2 333 act as switches that are digitally set. When the gate voltage is 0 volts on transistor MP4 341 or transistor MP2 333, they allow the current from the transistor MP3 339 and the transistor MP1 331 to flow down through and out to the word line drive signal 301. The word line drive signal 301 drives the word line comb 307 shown on FIG. 1. The logic control circuit 370 is set up so that write direction 1 and write direction 0 are never on at the same time.

In one example embodiment the voltage supply, Vdd, varies from 4.5 to 5 volts depending on the state being written to the MRAM 300. These Vdd example voltages are by way of example and not limitation and those skilled in the art will recognize that other Vdd values, such as 3 volts, are within the spirit and scope of the invention. The switches, transistors MP4 341 or MP2 333, are off during the beginning of any cycle in an open circuit condition. This prevents a direct Vdd to Vss short between sources. Generally, in the main word line driver 302, in the write '1' direction, a P channel source is connected and in the write '0' direction an N channel source is connected, which results in sourcing different directions, with different types of elements.

During the write '1' direction, the controls for the WLBIASR signal 334 and WLBIASW signal 332 are set independently so that a operation could be carried out at 10 milliamps or 15 milliamps, or any other low value. To exploit the architecture, the additive value for a write operation could be obtained, where a read was 15 milliamps and we needed to have a 40 milliamps, for a write, the setting could be set at 25 milliamps. The main word line drive allows the addition of these two current sources the transistor MP1 331 and the transistor MP3 339 to get additional current supply.

The write '0' direction involves a similar type of setup involving two current sources, transistors MN2 337 and MN4 345. Basically, the transistor MN2 337 and the transistor MN4 345 are biased, with a current mirror as described above. Transistor MN2 337 has a control signal, the bias read signal 325 applied to its gate. Transistor MN4 345 has the BIASNW signal 327 applied to its gate. BIASNW 327 and BIASNR 325 are set in a direct ratio to the WLBIASW signal 332 or the WLBIASR signal 334, respectively. For example, if the signal from transistor MN2 337 is putting out 15 milliamps, then the signal from the transistor MP1 331 is putting out 15 milliamps. The transistor MN4 345, the other current source, handles the write version of the current source going in the 0 direction. Transistor MN4 345 is proportional to the WLBIASW signal 332 so that if the current on top is 25 milliamps from transistor MP3 339, then we should have 25 milliamps through transistor MN4 345. And like above, these sources (for example, BIASNW 327, BIASNR 325, WLBIASW signal 332, WLBIASR signal 334) have gating switches on them to be able to turn them on when we need them and turn them off when we need them. Those gating switches are transistor MN1 335 for the transistor MN2 337 source and transistor MN3 343 for the transistor MN4 345 source. The length (Ls) on gating transistors MN1 335 and MN3 343 are 0.5 microns where the Ls of the sources themselves, the transistors MN2 337 and MN4 345 are 1.5 microns which gives more bias control on the devices and limits our overall working level (W/L) or current. The combination of these devices allows the main word line driver 302 to either source current going into the word line drive signal 301 which is between write '1' and write '0', or force current out the word line drive signal 301. Conceptually the transistor MP1 331 and the transistor MN2 337 are the read portion of the circuit, which sources 15 milliamps. Gate control for the transistor MN3 343 is provided by the NNW signal 353. The NNW signal 353 is generated by NOR 384 that takes the NOR of the write signal 372 and the output of the NAND2 377 that NANDS the ENN signal 376 and the ENWL signal 342. Gate control for transistor MP4 341 is provided by the NPW signal 351. The NPW signal 351 is generated by NOR 380, through inverter 390, that takes the NOR of the write signal 372 and the output of NAND1 375 that NANDS the ENP signal 374 and the ENWL signal 342.

Conceptually, the transistor MP3 339 and MN4 345 could be sourcing whatever current is needed to implement a write in addition to the read current; for example, +25 or +20. An advantage of this architecture is that there is not a lot of circuitry between Vdd and Vss. The transistor MP3 339 is an 800/1.5 ratio device. Transistor MP4 341 acts as a switch and is a 800/0.55 ratio device. At the multiplexer end of the word line 304A the current goes through an N channel transistor muxN transistor 416, which is a 200/0.5 device. The muxN transistor 416 is shown in FIG. 5. This allows for headroom. Headroom is the difference between Vdd and Vss. With Vdd equaling 5 or 4½ volts, and the transistors taking up a certain amount of that voltage range, approximately a volt and a-half, that provides 3 volts that can drop across the word line 304A, in a resistive sense, which gives the maximum current that, can be applied to a selected one of the word lines 304A-304H.

The architecture allows the main word line driver 302 to drive a higher load because of the additional headroom. For example, 3 volts of headroom into a 30 ohms word line results in 100 milliamps of maximum current. Or, 50 milliamps for a 60 ohms word line. This capability allows more flexibility with the architecture, such as driving a longer line, reducing the number of lines, and constructing larger overall arrays.

Figure 5:
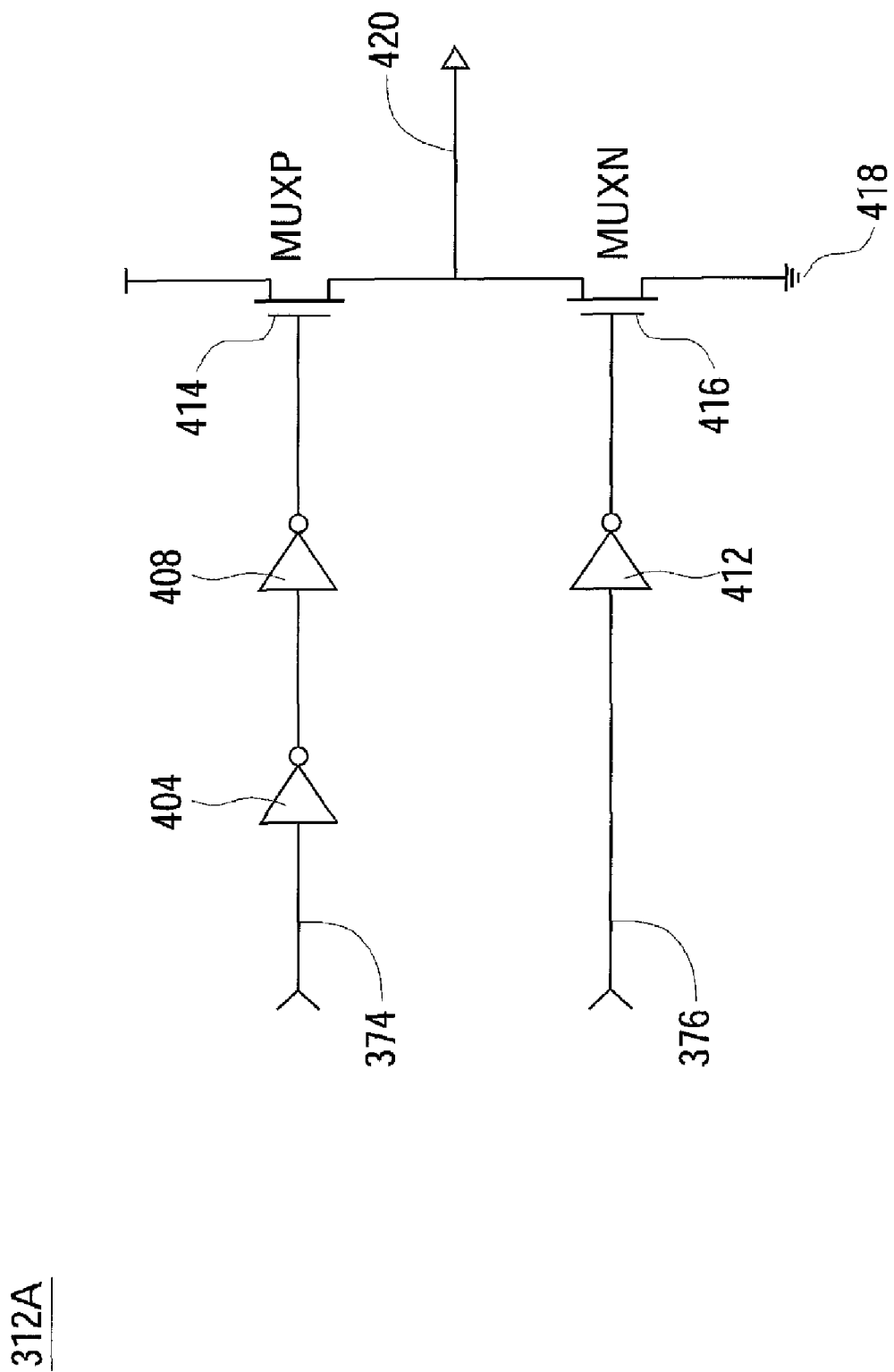
FIG. 5 shows a detailed schematic of a multiplexer circuit according to one embodiment of the present invention.

Refer now also to FIG. 5, which shows one embodiment of the multiplexer 312A of the invention. The ENP signal 374 controls the muxP transistor 414 through two inverters 404 and 408. The ENN signal 376 controls the muxN transistor 416 through inverter 412. Generally, when the muxP transistor 414 sources current and is active, the muxN transistor 416 acts to prevent current flow to ground 418, thus driving the mux word line signal 420. Generally, when the muxP transistor 414 is inactive, the muxN transistor 416 provides a path to ground 418. The sub word line driver 399 controls what multiplexer 312A-312H is active. The P channel on muxP transistor 414 is used for a read '0' direction or a write '0' direction. The N channel on muxN transistor 416 there is used for a read '1' direction or a write '1' direction.

Refer now to FIG. 6, which shows a multiplexer decoder 600 used to generate an ENP(7:0) 374A bussed multiplexer control signal and ENN(7:0) 376A bussed multiplexer control signal. The multiplexer decoder 600 accepts the address input signal 396 that is further divided into three address lines, address 601, address 602, address 603, as inputs as well as an ENP signal 374 and an ENN signal 376. The multiplexer decoder 600 does an address decode using signals 601 to 603 and activates one of eight muxP lines 671-678 and muxN lines 681-688. The muxP lines 671-678 are enabled by a plurality of NAND gates that have the ENP signal 374 as an input and the output of the decoded addresses as an input. The input signals are inverted by inverter 611 through 615 and provide input to inverters 621 through 625. NOR gates 631 through 638 then take decoded signals in a conventional fashion and generate inputs to NANDs 641 through 648 and 651 through 658 to provide the muxN signals 681 through 688 and muxP signals 671 through 678. The one logic train will be discussed in order to illustrate the other eight in the multiplexer decoder 600. The NOR 631 takes the three addressed lines 601 to 603 as an input and generates the NOT OR of the three lines as an output on 631. The NORs 631-638 decode the addresses by either taking the inverted or the non-inverted signal and providing eight unique cases in a standard fashion. The NAND 641 receives the output of NOR 631 and NANDs the ENP signal 374 to drive the muxP signal 671 when the ENP signal 374 is active when the first multiplexer is selected by the addresses 601 to 603. In this fashion, the multiplexer decoder 600 selects each multiplexer and activates the appropriate muxP and muxN line. NAND 651 in a similar fashion takes the output of the NOR 631 which decodes for the first multiplexer and provides an active muxN signal 681 if the ENN signal 376 is active. Those skilled in the art will recognize that other address decoding schemes are within the scope and spirit of the invention. Each multiplexer 312A-312H receives one bit from the ENP(7:0) 374A bus and one bit of the ENN(7:0) 376A bus that is connected to the ENP 374 and ENN 376 signal in the multiplexer, respectively, along mux control bus 398 shown in FIG. 1.

FIGS. 7, 8, 9 and 10 show the operation of the active components of the main word line driver 302, the sub word line driver 399 and the multiplexer 312A. In FIGS. 7, 8, 9 and 10 the inactive components are removed to aid in the understanding of the operation of the MRAM 300.

Figure 7:
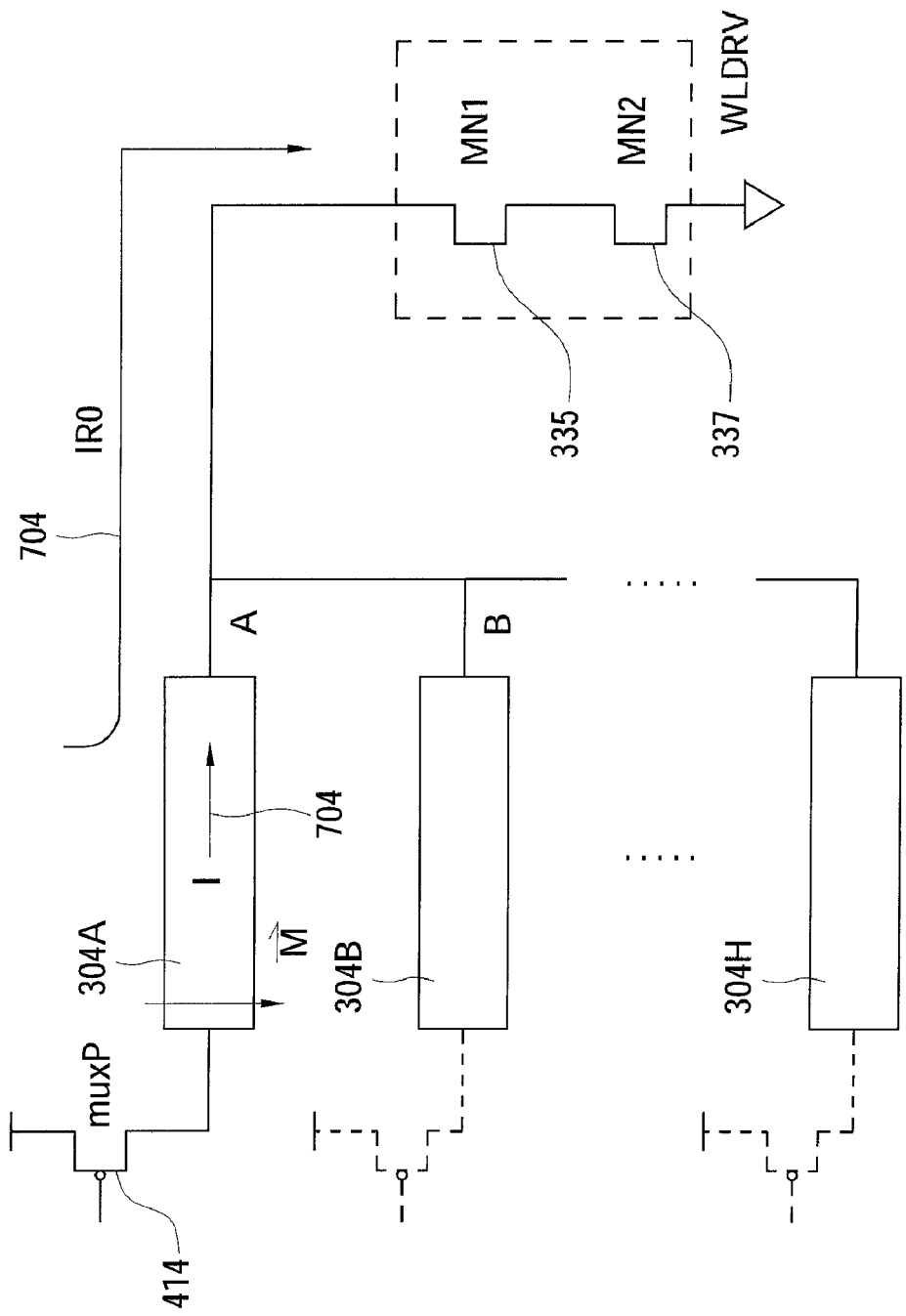
FIG. 7 shows a schematic diagram of the read 0 direction for the operation of the magnetic random access memory word line driver and decoder according to one embodiment of the present invention.

Refer now to FIG. 7 that shows the read 0 mode. In the read 0 mode, the current flows across the word line 304A from left to right. Current is designated IR0 704. The current 704 flows in word line 304A from the muxP transistor 414 and the transistor MN1 335 acting as a switch to transistor MN2 337. In this mode the muxP transistor 414 gate voltage is 0, which indicates the device is on and sourcing current to the word line 304A. The gate voltage on transistor MN1 335 is Vdd or 5 volts in this example, which turns transistor MN1 on. The gate voltage on transistor MN2 337 is ⅖ of Vdd or in this example 1.8 volts. Word lines 304B through 304H do not carry current when multiplexer 312A selects word line 304A.

Figure 8:
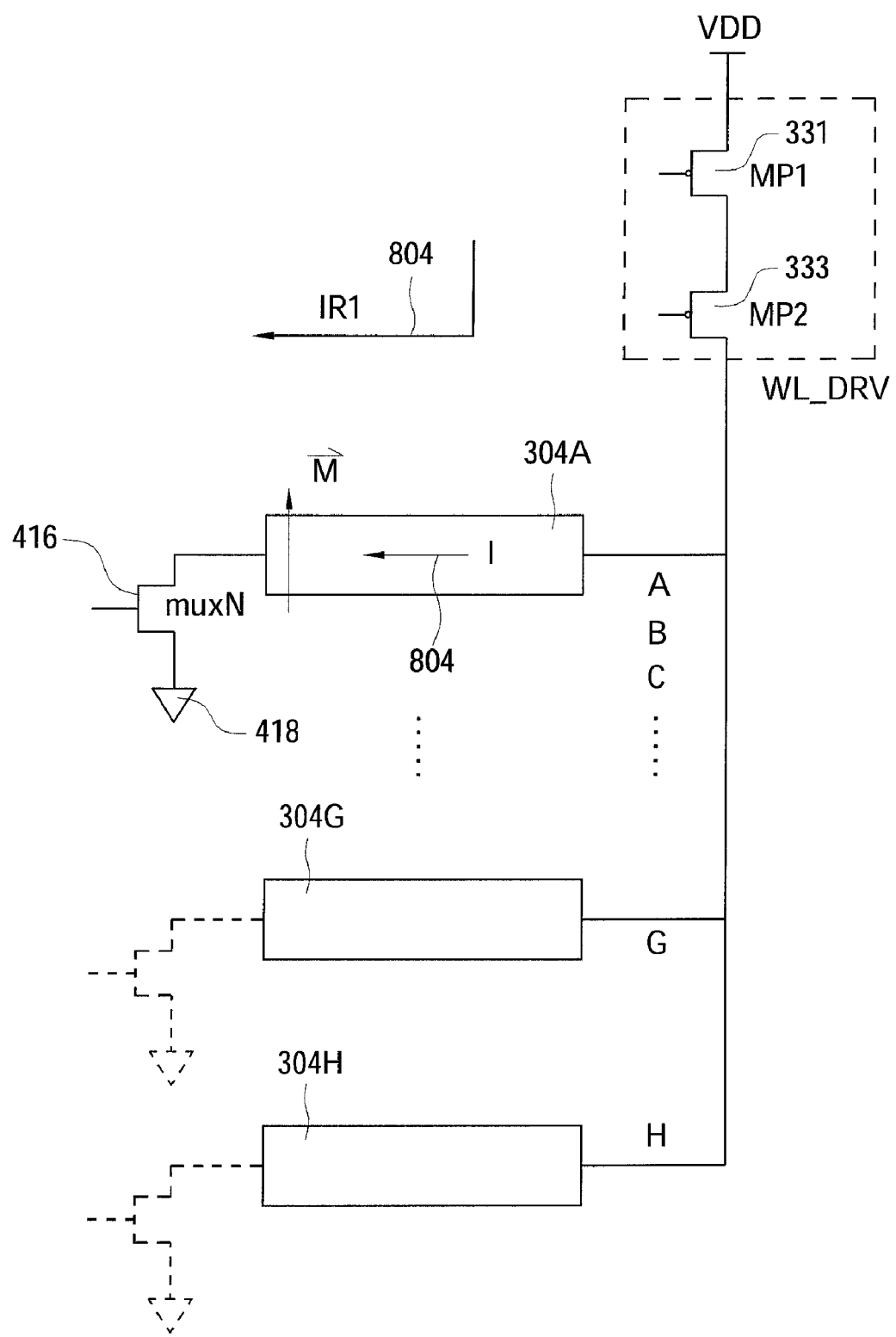
FIG. 8 shows a schematic diagram of the read 1 direction for the operation of the magnetic random access memory word line driver and decoder according to one embodiment of the present invention.

Refer now the FIG. 8 that shows the read 1 mode. In the read 1 mode the current IR1 804 goes from right to left through word line 304A. The transistor MP1 331 and the transistor MP2 333 are sourcing current 804 to the muxN transistor 416. The gate voltage on transistor muxN 416 is Vdd or 5 volts in this example, which turns the transistor on and allows current to flow to ground 418. Gate voltage on the transistor MP1 331 is 2.9 or approximately ⅗ of Vdd, plus or minus 10%. The gate voltage on transistor MP2 333 is 0 volts, which turns the transistor on and allows the current from MP1 331 to flow through the word line 304A.

Figure 9:
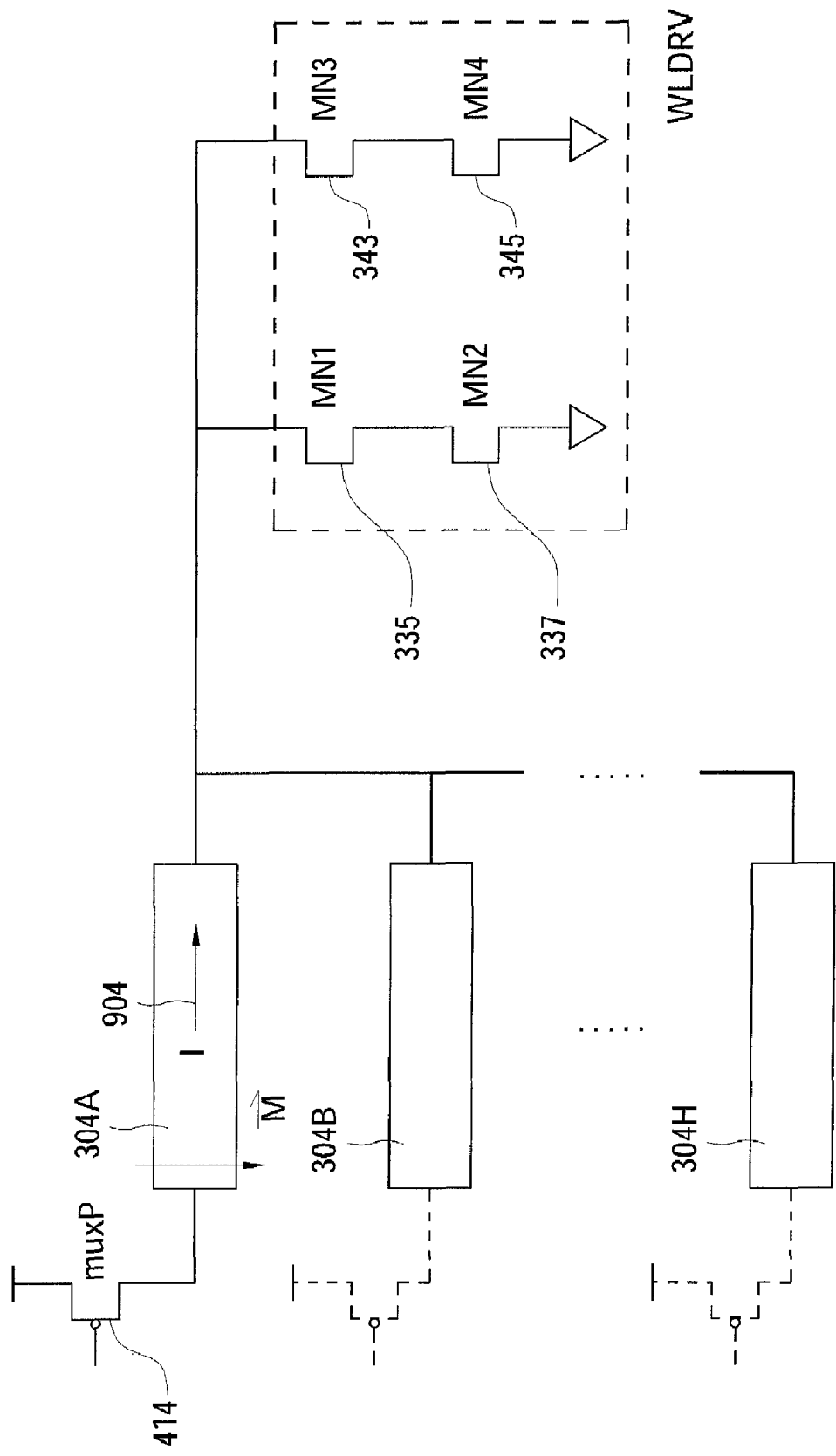
FIG. 9 shows a schematic diagram of the write '0' direction for the operation of the magnetic random access memory word line driver and decoder according to the one embodiment of the present invention.

Refer now to FIG. 9, which shows the write '0' mode. The current in the write '0' mode 904 travels from left to right through word line 304A. Current flows from the muxP transistor 414 through word line 304A to the main word line driver 302 through transistors MN2 337 and MN4 345. Transistors MN1 335 and MN3 343 act as switches for transistors MN2 337 and MN4 345 respectively. In the write '0' mode gate voltage on the muxP transistor 414 is 0 volts, which turns on the muxP transistor 414. Gate voltage on transistor MN1 335 and MN3 343 is set to Vdd, or 5 volts, which turns on those transistors. The gate voltage on transistor MN2 337 and MN4 345 is 1.8 volts or ⅖ of Vdd. This allows a write '0' current that is larger than the read 0 current to travel through the word line 304A.

Table A summaries the gate voltages on transistors in the main word line driver 302 during each of the four memory access modes. Those skilled in the art will recognize that these voltages are different for different technologies. In the preferred embodiment Vdd ranges from 4.5 to 5.5 volts.

TABLE A

Gate Voltage Table for Access Modes

|  | Read 0 | Read 1 | Write '0' | Write '1' |
|---|---|---|---|---|
| MuxP | On 0 | Off Vdd ± 10% Vdd | On 0 | Off Vdd ± 10% Vdd |
| MuxN | Off 0 | On Vdd ± 10% Vdd | Off 0 | On Vdd ± 10% Vdd |
| MP3, MP6 | ⅗ Vdd ± 10% Vdd | ⅗ Vdd ± 10% Vdd | ⅗ Vdd ± 10% Vdd | ⅗ Vdd ± 10% Vdd |
| MP1, MP5 | ⅗ Vdd ± 10% Vdd | ⅗ Vdd ± 10% Vdd | ⅗ Vdd ± 10% Vdd | ⅗ Vdd ± 10% Vdd |
| MN2 | ⅖ Vdd ± 10% Vdd | ⅖ Vdd ± 10% Vdd | ⅖ Vdd ± 10% Vdd | ⅖ Vdd 10% Vdd |
| MN4 | ⅖ Vdd ± 10% Vdd | ⅖ Vdd ± 10% Vdd | ⅖ Vdd ± 10% Vdd | ⅖ Vdd 10% Vdd |
| MP2 | off Vdd ± 10% Vdd | On 0 | off Vdd ± 10% Vdd | On 0 (short) |
| MN1 | On Vdd ± 10% Vdd | Off 0 | On Vdd ± 10% Vdd | Off 0 |
| MP4 | Off Vdd ± 10% Vdd |  |  | On 0 (Short) |
| MN3 | Off 0 | Off 0 | On Vdd ± 10% Vdd | Off 0 |

A variable delay chain that can be controlled drives the ENP signal 374 and ENN signal 376. The control of the ENP signal 374 and the ENN signal 376 are current sources activated to minimize adverse timing characteristics caused by the large currents being switched. The word line 304A acts as a rapidly dampened oscillation, which means that the word line current requires control at the beginning of each cycle. The overall magnitude of our word line current at any point in the cycle could have performance implications. The variable delay chain turns on the current switches, transistors MP2 333, MP4 341, MN1 335 and MN3 343 in the proper order to allow for a small RC characteristic. The ENP signal 374 and the ENN signal 376 can be timed to change what the pulse width for the write '1' direction or the write '0' direction. The pulse width can range from 30 nanoseconds to at least 100 to 150 nanoseconds or more. The operational timing of the current supply on the word line 304A has a dramatic effect on the reliability of the MRAM 300. For example, assume that the target write word line current is 40 milliamps, upon word line current activation a spike, caused by turn on transients may drive the word line 304A to 44 milliamps. This spike may be enough, especially during the write phase, to spuriously alter some of the memory elements not targeted for the write operation. Spiking up the word line current also spikes the magnetic field around the word line 304A because the magnetic field is proportional to the current directly. This requires the current supply switches, transistors MP2 333, MP4 341, MN1 335 and MN3 343, be turned on and off in a proscribed manner. The timing of the bias current is limited by the amount of time it takes the bias voltage to stabilize. This requires the current sources, transistors MP1 331, MP3 339, MN2 337, and MN4 345, to be well set-up before being turned on limiting the amount of flexibility in that part of the main word line driver 302.

Figure 10:
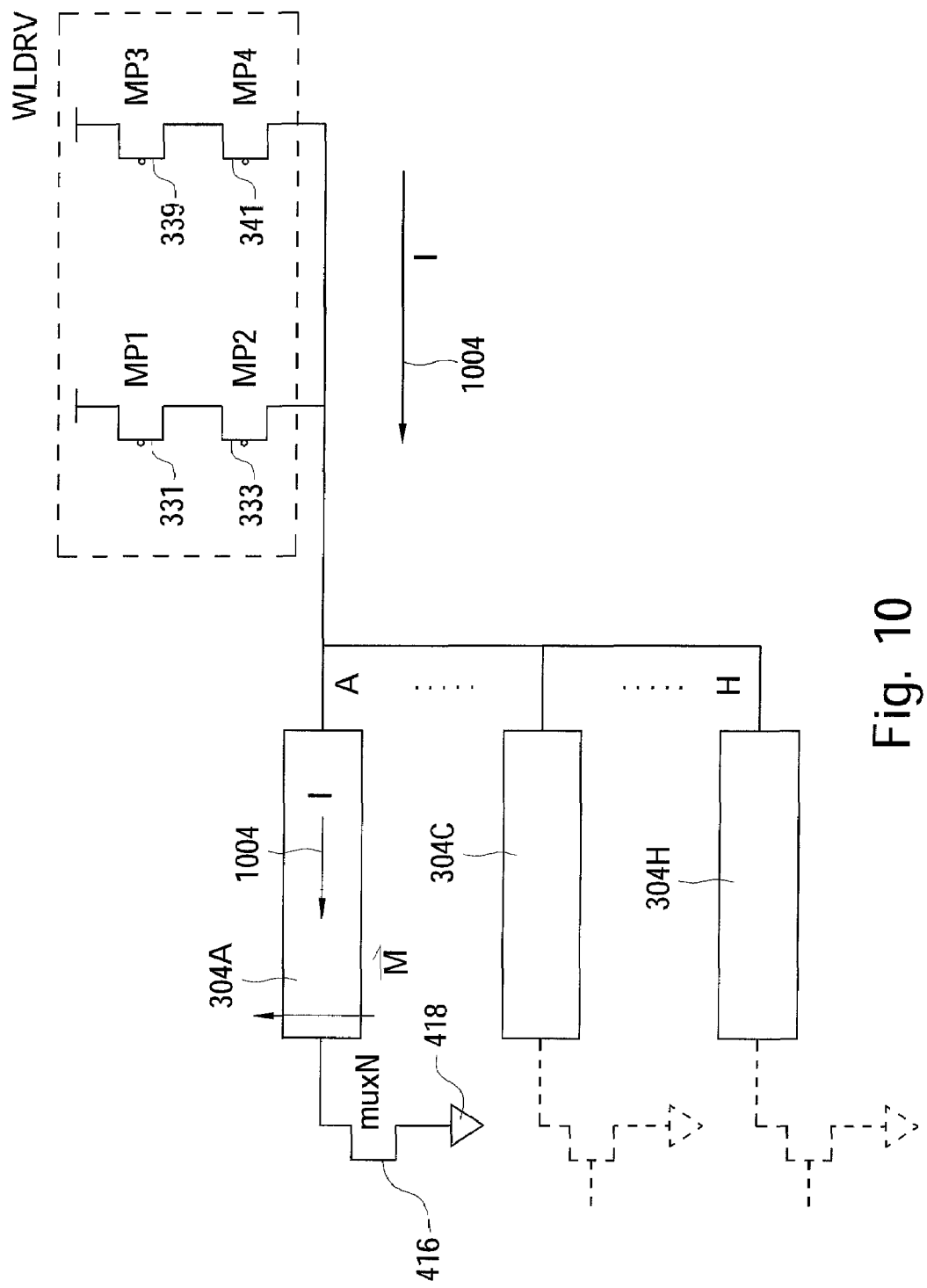
FIG. 10 shows a schematic diagram of the write '1' direction for the operation of the magnetic random access memory word line driver according to one embodiment of the present invention.

Refer now to FIG. 10, which shows the write '1' mode. In the write '1' mode the current flows from right to left, the current 1004 flows from right to left through word line 304A. The current starts at the transistor MP1 331 and the transistor MP3 339, which are gated by the transistors MP2 333 and MP4 341, respectively. The muxN transistor 416 allows current to flow through word line 304A to ground 418. The gate voltage on the muxN transistor 416 in the write '1' mode is 5 volts and allows current 1004 to flow to the word line 304A. The gate voltage on transistor MP2 333 and transistor MP4 341 are 0 volts, which turns the transistors on, allowing current to flow from transistors MP1 331 and MP3 339, respectively. The gate voltage on transistor MP1 331 and MP3 339 in the write '1' mode is 3.9 volts or ⅗ Vdd ±10%. This allows the write '1' direction current which is greater than the Read '1' direction current to flow through word line 304A. Generally in the write case there are two current sources driving the word line 304A.

Figure 11:
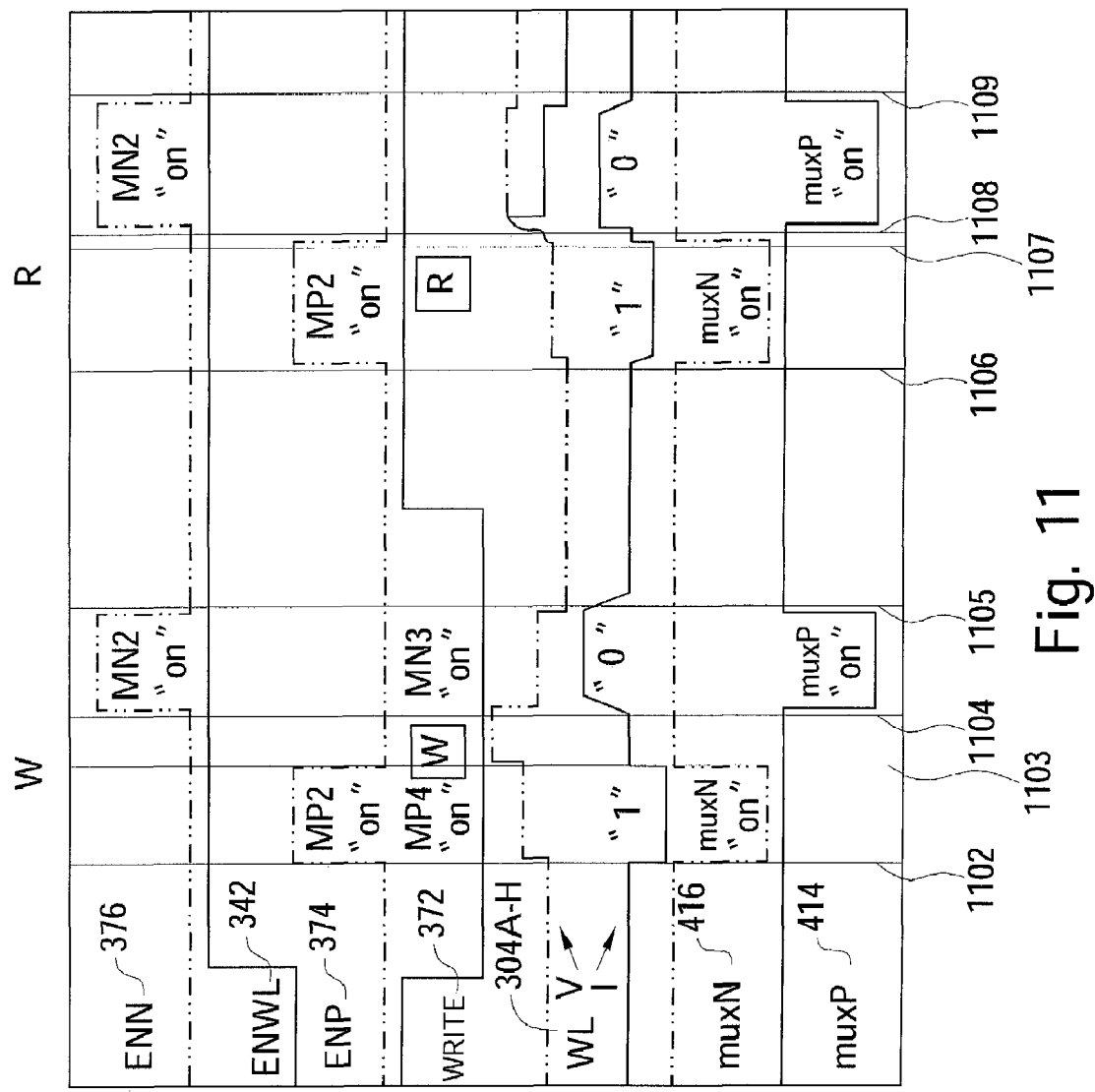
FIG. 11 shows a timing diagram of the control signals of the magnetic random access memory word line driver and decoder according to the one embodiment of the present invention.

Refer now to FIG. 11, which shows a timing diagram illustrating the relative timing of control signals. The write '1' operation requires that the ENWL signal 342 be enabled, the ENN signal 376 is low, and that the ENP signal 374 goes high. The write signal 372 is low which turns MP4 341 and MN3 343 on. The muxN transistor 416 is turned on and the muxP transistor 414 off. The beginning of the write '1' operation is indicated by time line 1102. During the write '1' operation, the word line voltage 304A goes from 0 volts to roughly ⅗ of Vdd or 2.9 volts. The word line current is negative 40 milliamps. The negative sign indicates current going from left to right, or current flow from the multiplexer 312A to the main word line driver 302. This creates the conditions needed to write a value 1 into a memory element. When the write '1' operation ends at time line 1103, the ENWL signal remains enabled, the ENN signal 376 still is disabled, and the ENP signal 374 is disabled, turning the transistor MP2 333 off, the muxN transistor 416 signal turns the muxN transistor 416 off and the muxP transistor 414 remains off. This establishes the word line current at 0 and the word line voltage goes to Vdd or 4.5 volts.

At time line 1104, the write '0' case is shown where the ENWL signal is enabled, still high, the ENN signal 376 turns on transistor MN2 337, the ENP signal is low which means transistor MP4 341 is on and MN3 343 is on and the muxP transistor 414 is turned on. The word line voltage then goes to 2.9 volts or ⅗ Vdd and the word line current goes to +40 milliamps, which means the current travels in the write '0' direction which is from left to right, indicating current from the multiplexer 312A to the main word line driver 302. At the end of the write '0' operation, shown by time line 1105, the ENWL signal 342 is enabled, the ENN signal 376 is disabled, and the NP signal is disabled. This turns off the muxN transistor 416 and the muxP transistor 414 and the word line voltage drops to 0 and the current drops to 0.

During the read '1' operation, indicated by time line 1106, the ENWL signal is enabled, the ENN signal 376 is disabled, and the ENP signal 374 is enabled, turning on transistor MP2

333. The muxN 416 is then turned on, the muxP transistor 414 is off and the word line voltage goes to 2.9 volts and the word line current goes to minus 20 milliamps which indicates that the current is going in the direction right to left, which is from the main word line driver 302 to the multiplexer 312A. At the end of the read '1' operation shown as time line 1107, the ENWL signal 342 is active, the ENN signal 376 is low or inactive, the ENP signal 374 is deactivated shutting off transistor MP2 333. The muxN transistor 416 turns off and the word line voltage goes to Vdd in the word line current is 0 volts.

The start of a read '0' operation, indicated by time line 1108, has the ENWL signal 342 enabled with the ENN signal 376 activating turning on the transistor MN2 337. The ENP signal 374 remains off keeping transistor MP2 333 off. The muxP transistor 414 turns on and the muxN transistor 416 remains off. This sets the word line voltage to ⅗ Vdd or 2.9 volts and the word line current is set to plus 20 milliamps which indicates that the current is flowing in a 20 '0' direction from left to right, from multiplexer 312A to the main word line driver 302. At the end of the read '0' operation, indicated by time line 1109, the ENN signal 376 shuts off deactivating transistor MN2 337, the ENP signal 374 remains off. The word line 304A voltage returns to 0 volts and the word line current goes to 0 milliamps.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A magnetic random access memory with word line driver and decode apparatus, comprising:
    a plurality of memory segment;
    a plurality of word lines, disposed on the memory segments, being capable of providing an electric field for reading and writing data on the magnetic random access memory;
    a main word line driver connected to first terminals of the word lines and providing a reading current for read operation of the word lines and a writing current for write operation of the word lines, wherein the main word line driver further comprises a logic control circuit determining the read operation and the write operation of the word lines;
    a plurality of multiplexers connected to second terminals, opposite to the first terminals, of the respective word lines and capable of controlling directions of the reading current and the writing current on the word lines; and
    a sub word line driver connected to the multiplexers by a mux control bus and capable of choosing a required multiplexer from the multiplexers to be active to process one of the word lines;
    wherein the main word line driver, the multiplexers and the sub word line driver together decode addresses and perform the read and write operations to read and write data on the magnetic random access memory.

2. The magnetic random access memory with word line driver and decode apparatus of claim 1, wherein the main word line driver provides the current for the read and write operation having an approximately ratio of 1:2.

3. The magnetic random access memory with word line driver and decode apparatus of claim 1, wherein each of the memory segment further comprises a plurality of sense strings and a plurality of strap layer segments, the sense strings are positioned on and orthogonal to the word lines, the strap layer segments are positioned between the word lines, each of the sense strings is connected by the strap layer segments in series.

4. The magnetic random access memory with word line driver and decode apparatus of claim 3, wherein each of the sense strings further comprises a plurality of sub bits, the sub bits are positioned on and orthogonal to the word lines, each of the sub bits is connected by the strap layer segments in series.

5. The magnetic random access memory with word line driver and decode apparatus of claim 3, wherein the memory segment further comprises a plurality of sense lines and each of the sense strings further comprises an output end, the sense lines are positioned between the sense strings, and the output end of each of the sense strings is connected alternatively to the sense lines and capable of providing for noise stabilization and reduction.

6. The magnetic random access memory with word line driver and decode apparatus of claim 5, wherein the memory segment further comprises a differential amplifier, the differential amplifier is connected to the sense lines and capable of detecting the voltage difference in the signal provided by the sense lines.

7. The magnetic random access memory with word line driver and decode apparatus of claim 1, wherein the main word line driver further comprises a P-channel transistor and an N-channel transistor and is capable of activating a pull-up or pull down node to establish the current for the required word line.

8. The magnetic random access memory with word line driver and decode apparatus of claim 1, wherein each of the multiplexers further comprises:
    a P-type transistor;
    a first inverter connected to the P-type transistor; and
    a second inverter connected to the first inverter;
    wherein the P-type transistor, the first inverter and the second inverter cooperatively form a current path for a read "0" or write "0" operation.

9. The magnetic random access memory with word line driver and decode apparatus of claim 1, wherein each of the multiplexers further comprises:
    a N-type transistor; and
    a third inverter connected to the N-type transistor;
    wherein the N-type transistor and the third inverter cooperatively form a current path for a read "1" or write "1" operation.

10. The magnetic random access memory with word line driver and decode apparatus of claim 1, wherein the sub word line driver further comprises a multiplexer decoder for decoding an address input signal to generate multiplexer control signals to control the multiplexers.

11. The magnetic random access memory with word line driver and decode apparatus of claim 1, wherein the word lines further comprises a conducting header receiving a word line drive signal output from the main word line driver and capable of carrying and distributing the current to each of the word lines.

12. The magnetic random access memory with word line driver and decode apparatus of claim 1, wherein the sub word line driver receives an address input signal and chooses the required multiplexer from the multiplexers to be active based on the address input signal.

13. A current controller comprising:
    a plurality of word lines for providing an electric field for read and write operations;

a main word line driver connected to first terminals of the word lines and providing a reading current for the read operation of the word lines and a writing current for the write operation of the word lines, wherein the main word line driver further comprises a logic control circuit receiving a write signal determining the read operation and the write operation of the word lines;

a plurality of multiplexers connected to second terminals, opposite to the first terminals, of the respective word lines and capable of controlling directions of the reading current and the writing current on the word lines; and a sub word line driver connected to the multiplexers by a mux control bus and capable of choosing a required multiplexer from the multiplexers to be active to process one of the word lines;

wherein the main word line driver, the multiplexers and the sub word line driver together decode addresses and perform the read and write operations of the word lines.

14. The current controller of claim 13, wherein the main word line driver provides the current for the read and write operation having an approximate ratio of 1:2.

15. The current controller of claim 13, wherein the main word line driver further comprises a P-channel transistor and an N-channel transistor and is capable of activates a pull-up or pull down node to establish the current for the required word line.

16. The current controller of claim 13, wherein each of the multiplexers further comprises:

a P-type transistor;
a first inverter connected to the P-type transistor; and
a second inverter connected to the first inverter;
wherein the P-type transistor, the first inverter and the second inverter cooperatively form a current path for a read "0" or write "0" operation.

17. The current controller of claim 13, wherein each of the multiplexers further comprises:

a N-type transistor; and
a third inverter connected to the N-type transistor:
wherein the N-type transistor and the third inverter cooperatively form a current path for a read "1" or write "1" operation.

18. The current controller of claim 13, wherein the sub word line driver further comprises a multiplexer decoder for decoding an address input signal to generate multiplexer control signals to control the multiplexers.

19. The current controller of claim 13, wherein the word lines further comprises a conducting header receiving a word line drive signal output from the main word line driver and capable of carrying and distributing the current to each of the word lines.

20. The current controller of claim 13, wherein the sub word line driver receives an address input signal and chooses the required multiplexer from the multiplexers to be active based on the address input signal.

* * * * *